(12) United States Patent
Chen et al.

(10) Patent No.: US 7,422,962 B2
(45) Date of Patent: Sep. 9, 2008

(54) METHOD OF SINGULATING ELECTRONIC DEVICES

(75) Inventors: Chien-Hua Chen, Corvallis, OR (US); Zhizhang Chen, Corvallis, OR (US); Steven R Geissler, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 291 days.

(21) Appl. No.: 10/975,797

(22) Filed: Oct. 27, 2004

(65) Prior Publication Data

US 2006/0088980 A1 Apr. 27, 2006

(51) Int. Cl.
*H01L 21/30* (2006.01)
(52) U.S. Cl. .................. 438/456; 438/458; 438/460; 438/462; 257/E21.599
(58) Field of Classification Search .......... 438/460, 438/458, 462, 456
See application file for complete search history.

(56) References Cited

U.S. PATENT DOCUMENTS

| | | | |
|---|---|---|---|
| 5,668,033 | A | 9/1997 | Ohara |
| 6,479,320 | B1 | 11/2002 | Gooch |
| 6,734,083 | B2 * | 5/2004 | Kobayashi ............... 438/462 |
| 6,777,267 | B2 * | 8/2004 | Ruby et al. ............... 438/113 |
| 2003/0089394 | A1 | 5/2003 | Chang |
| 2004/0058476 | A1 | 3/2004 | Enquist |
| 2004/0067604 | A1 * | 4/2004 | Ouellet et al. ............ 438/108 |
| 2004/0157407 | A1 * | 8/2004 | Tong et al. .............. 438/455 |
| 2004/0161871 | A1 * | 8/2004 | Omori .................... 438/68 |
| 2005/0176166 | A1 * | 8/2005 | Chen et al. ............... 438/51 |
| 2005/0245069 | A1 * | 11/2005 | Shepard ................... 438/626 |
| 2006/0001123 | A1 * | 1/2006 | Heck et al. ............... 257/528 |
| 2006/0024919 | A1 * | 2/2006 | Yang ...................... 438/460 |

FOREIGN PATENT DOCUMENTS

| | | |
|---|---|---|
| EP | 1333486 | 8/2003 |
| WO | WO 2004/025727 | 3/2004 |
| WO | WO2004044980 A2 * | 5/2004 |

OTHER PUBLICATIONS

EV620 Precision Alignment Systems, EV620 Series, EV Group 2000/V.008.04; http://www.EVGroup.com. 2000.
Williams, Kirt R., Etch Rates for Micromachining Processing-Part II, Journal of Microelectromechanical Systems, vol. 12, No.6, Dec. 2003.
Persson, "Fundamental requirements on MEMS packaging and reliability", Advanced Packaging Materials, 2002, Proceedings 2002 8th Intl Symposium on Mar. 3-6 2002, pp. 1-7, XP010583907, IEEE, Piscataway, NJ USA.

\* cited by examiner

*Primary Examiner*—Zandra Smith
*Assistant Examiner*—Christy L Novacek

(57) ABSTRACT

A method of singulating electronic devices, including aligning a saw blade over a lid street disposed on a lid substrate that is disposed over a device substrate. An electronic device that includes a bond pad is disposed on the device substrate, wherein the lid street is disposed over the bond pad. In addition, the method also includes sawing partially through the lid street to form a trench in the lid street. The trench includes a trench bottom in the lid substrate.

31 Claims, 6 Drawing Sheets

METHOD OF SINGULATING ELECTRONIC DEVICES

BACKGROUND

Description of the Art

As the demand for cheaper and higher performance electronic devices continues to increase there is a growing need to develop higher yield lower cost manufacturing processes for electronic devices especially in the area of device packaging. The recent increased interest in the emerging area of Micro-Electro-Mechanical Systems (MEMS) is a good example where new device packaging technologies are being sought. These systems are being developed as smaller alternative systems to conventional electromechanical devices such as relays, actuators, sensors, and valves and other transducers. In addition, such electromechanical devices incorporated in a MEMS device can be further integrated with integrated circuits providing improved performance over conventional systems such as in the emerging area of micro-mirror display systems. Many types of transducers, incorporated into MEMS devices, such as micro-mirrors, micro-movers, vacuum sensors, gas flow sensors, infrared detectors, and AC power converters operate in harsh environments that require protection or isolation, of at least a portion of the device, from, for example, temperature, pressure, or humidity If these problems persist, the continued growth and advancements in the use electronic devices, especially MEMS devices, in various electronic products, seen over the past several decades, will be reduced. In areas like consumer electronics, the demand for cheaper, smaller, more reliable, higher performance electronics constantly puts pressure on improving and optimizing performance of ever more complex integrated devices. The ability, to optimize the cost and performance packaging technologies will open up a wide variety of applications that are currently either impractical or not cost effective today.

DESCRIPTION OF THE PREFERRED EMBODIMENTS

This invention is directed to substrate-level packaging that provides hermetically sealing one or more devices at the substrate level under a controlled environment before singulation of the device die. Typically the present invention is carried out at the wafer level; however, other substrate sizes both larger and smaller than typical wafer sizes also may be utilized. The devices are sealed utilizing a lid substrate that is bonded to a device substrate providing protection of the devices prior to singulation typically performed by sawing. The present invention utilizes a post-bond sawing of the lid to generate trenches having trench bottoms in the lid sustrate. Subsequent processing is utilized to expose the contact pads disposed around the periphery of the device. Processes that may be utilized in the present invention include, for example, deep reactive ion etching (DRIE), wet etching, laser ablation, ion beam milling, grit blasting, and fully sawing through the lid using precise z-axis control of the saw blade. The present invention improves the overall packaging yield of good die because the process is less complex and the devices are sealed and protected prior to sawing, leading to a lower cost manufacturing process. In addition, bonding, sealing, or a combination of both at the wafer or substrate level provides for a higher yield by increasing the environmental control inside the hermetically packaged device just prior to sealing. Further, by exposing the contact pads through the sawing process, a simple and cost effective technique of providing contact pads around all four die edges of the typical device is enabled.

It should be noted that the drawings are not true to scale. Further, various elements have not been drawn to scale. Certain dimensions have been exaggerated in relation to other dimensions in order to provide a clearer illustration and understanding of the present invention. In particular, vertical and horizontal scales may differ and may vary from one drawing to another. In addition, although some of the embodiments illustrated herein are shown in two dimensional views with various regions having height and width, it should be clearly understood that these regions are illustrations of only a portion of a device that is actually a three dimensional structure. Accordingly, these regions will have three dimensions, including length, width, and height, when fabricated on an actual device.

Moreover, while the present invention is illustrated by various embodiments, it is not intended that these illustrations be a limitation on the scope or applicability of the present invention. Further it is not intended that the embodiments of the present invention be limited to the physical structures illustrated. These structures are included to demonstrate the utility and application of the present invention to presently preferred embodiments.

Figure 1A:
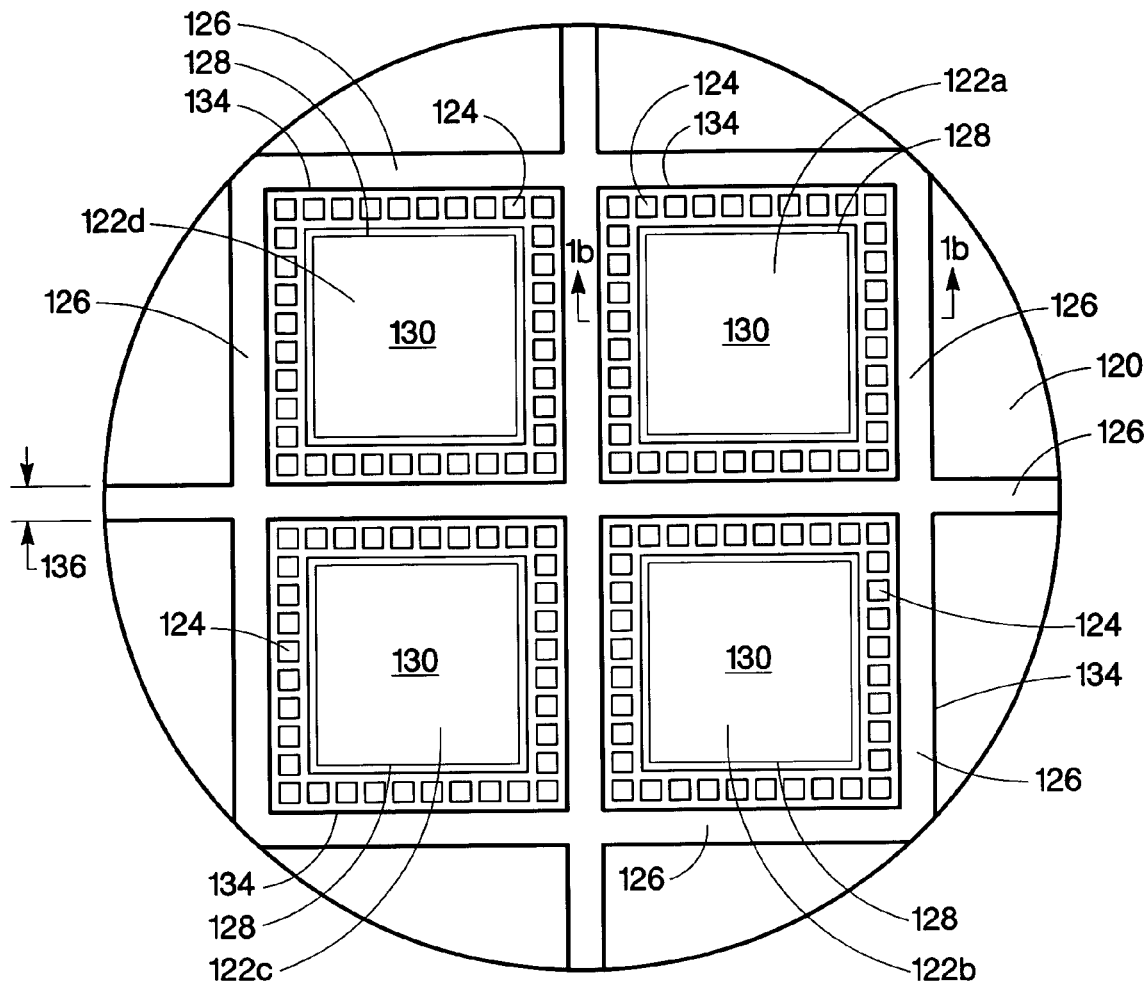
FIG. 1a is a top plan view of a device substrate according to an embodiment of the present invention.
Figure 1B:
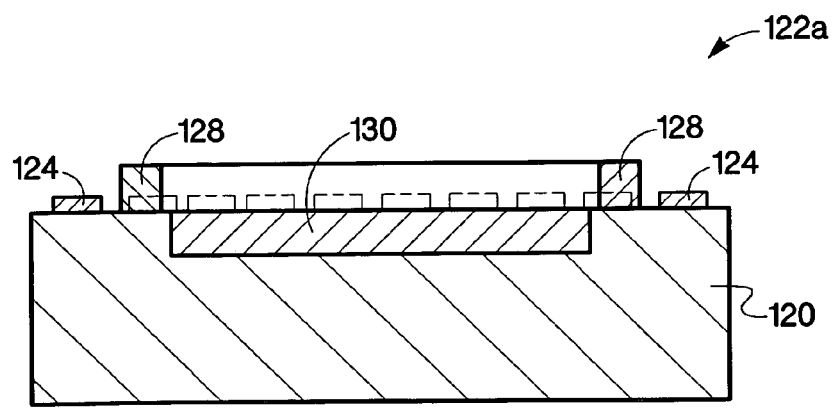
FIG. 1b is a cross-sectional view along 1b-1b of FIG. 1a showing an electronic device fabricated on the device substrate according to an embodiment of the present invention.

A top plan view of a device substrate that may be utilized in employing an embodiment of the present invention is illustrated in FIG. 1a. In this embodiment, device substrate 120 includes electronic devices 122a, 122b, 122c, and 122d disposed on the device substrate; however, it should be understood that 4 devices are shown for illustrative purposes only and that in alternate embodiments, device substrate 120 may include any number of electronic devices disposed thereon including only a single device as well as any number greater than one. Each electronic device includes at least one bond pad 124 disposed adjacent, or proximate, to device periphery 134. The at least one bond pad provides for electrical connection to the electronic device. The number of bond pads shown in FIG. 1a is for illustrative purposes only. In alternate embodiments, each electronic device may include any number of bond pads disposed thereon including only a single bond pad as well as any number greater than one. In addition, each electronic device also includes device bond ring 128 disposed on device substrate 120 with a particular embodiment illustrated, in FIGS. 1a and 1b. Further, as illustrated, in a cross-sectional view, in FIG. 1b each electronic device also includes device region 130 that is represented as only a single layer to simplify the drawing. It should be appreciated that device region 130 typically can be realized as a stack of thin film layers formed on or within substrate 120 or various combinations of both on and within the substrate. Device region 130 may include active devices such as transistors (including thin-film-transistor (TFT) or amorphous silicon transistors), diodes, logic cells, or any other type of solid state devices or microfabricated vacuum devices as well as sensors, transducers, electron emitters, bolometers, and superconductoring high Q RF filters to name just a few of the many active devices that may be utilized, either separately or in combination, in the present invention. In alternate embodiments, device region 130 also may be integrated with various MEMS devices such as microfluidic channels, reactor chambers, micromovers, and actuators to name just a few of the many MEMS devices that may be utilized. For example, device substrate 120 may include micro-fabricated devices such as a micro mirror disposed thereon. Another example is a bolometer or other radiation detector having a light absorbing surface disposed on device substrate. The particular structure or structures of the devices included in device region 130 will depend on the particular application in which electronic device 122 is utilized and is not limited in the present invention. Device substrate 120 also includes streets 126 formed in substrates between electronic devices 122a-122d, wherein each device street has device street width 136. Although, as illustrated in FIG. 1a, device streets 126 have a common width, it should be appreciated that, in alternate embodiments, each device street width may vary.

The present invention may utilize a wide variety of materials for device substrate 120. Substrate 120 may be any suitable material including semiconductors, metals and alloys, inorganic dielectric materials, polymeric materials and mixtures thereof. The particular material utilized for device substrate 120 will depend on various factors, such as, the particular application in which the device will be utilized, both processing temperatures and operating temperatures of the device, the presence or absence of active electronic devices, and the thermal and mechanical properties of the device and the substrate.

For those applications utilizing active semiconductor devices such as transistors, generally the substrate may be formed utilizing any of the conventional semiconductor materials, such as silicon, germanium, gallium arsenide, indium phosphide, and silicon carbide to name a few. Active devices may be formed utilizing conventional semiconductor processing equipment. Other substrate materials also may be utilized such as, for example, various glasses, aluminum oxide and other inorganic dielectrics can be utilized. Materials such as magnesium fluoride, and cryolite, and various glasses such as any of the borosilicate, soda lime or quartz glasses (including crystalline and amorphous glasses) as well as silicon nitrides and oxides, and silica mixed with oxides of, for example, potassium, calcium, barium or lead also may be utilized. In addition, metals such as aluminum and tantalum that electrochemically form oxides, such as anodized aluminum or tantalum, may be utilized. Other metals with a dielectric layer formed on the metal also may be utilized. For those applications utilizing non-semiconductor substrates, active devices also may be formed on these materials utilizing techniques such as amorphous silicon or polysilicon thin film transistor (TFT) processes or processes used to produce organic or polymer based active devices. Accordingly, the present invention is not intended to be limited to those devices fabricated in silicon semiconductor materials, but will include those devices fabricated in one or more of the available semiconductor materials and technologies known in the art. Further, the substrate is not restricted to typical wafer sizes, and may include processing a sheet or film, for example, a single crystal sheet or a substrate handled in a different form and size than that of conventional wafers or substrates.

For those applications desiring a polymeric substrate, typically a wide variety of polymer film materials such as polyimide, polyester (PET), polyethylene naphthalate (PEN), polyvinyl chloride, polybutylene terephthalate (PBT), polyethylene naphthalate (PEN), polypropylene (PP), polyethylene (PE), polyurethane, polyamide, polyarylates, and polyester based liquid-crystal polymers to name a few, may be used to form the substrate. For those applications utilizing active devices on a flexible substrate typically conventional thin film processing equipment may be utilized to form the active devices, such as amorphous silicon or polysilicon thin film transistor (TFT) processes. However, various techniques utilized to produce organic or polymer based active devices also may be utilized. In addition, the techniques for thinning semiconductor wafers to make a flexible substrate with active devices may also be utilized.

Figure 2A:
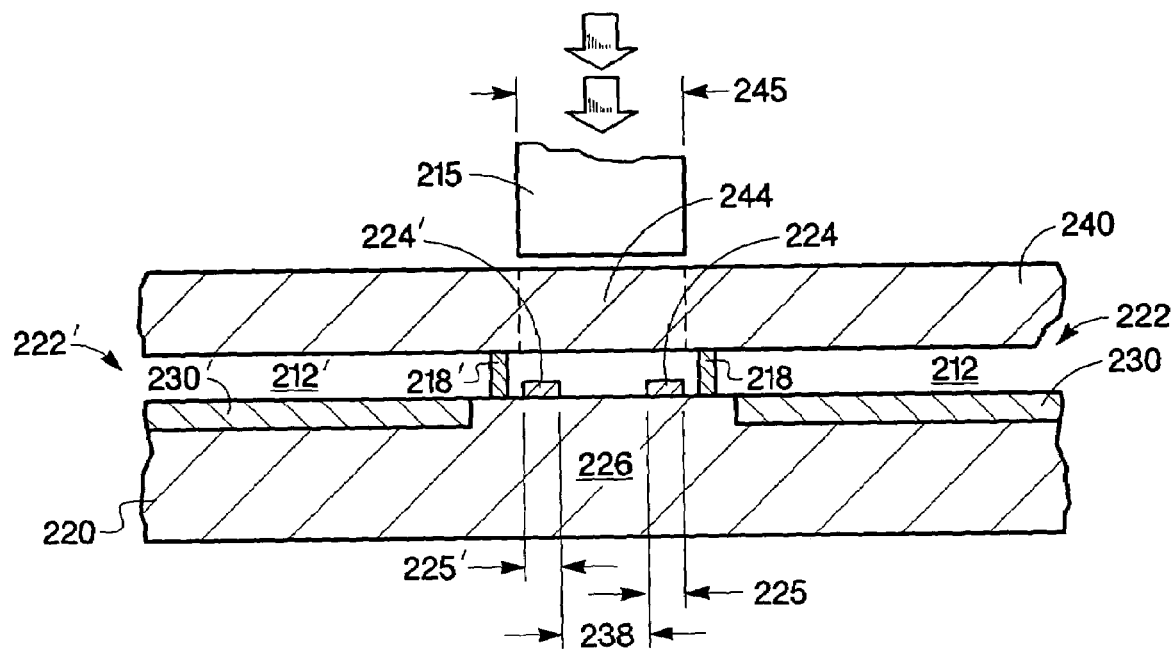
FIGS. 2a-2b are cross-sectional views of processes according to an embodiment of the present invention.
Figure 2B:
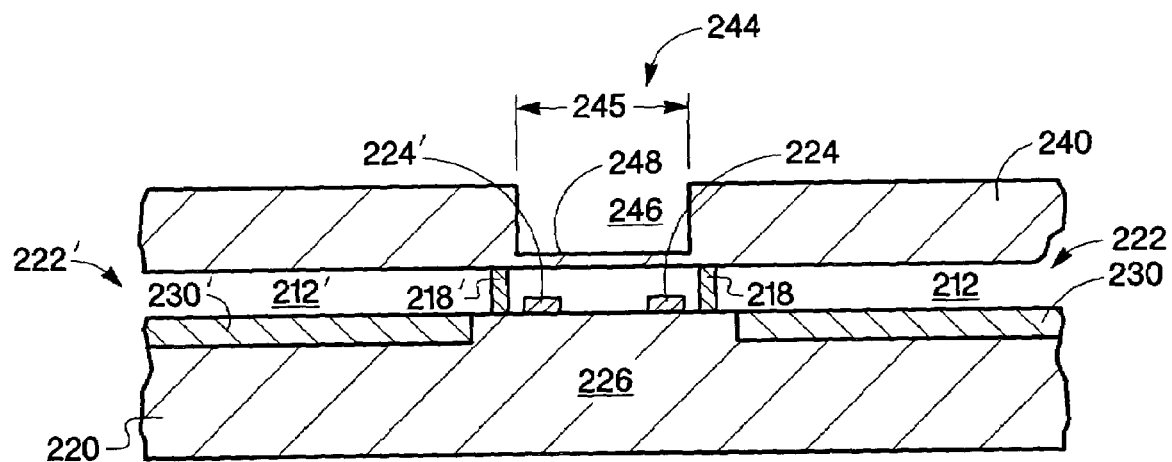

FIGS. 2a-2b are cross-sectional views of two processes used to create embodiments of the present invention. In FIG. 2a the alignment of saw blade 215 over lid street 244 is schematically depicted over a portion of lid substrate 240 and device substrate 220. Lid street 244 is disposed on lid substrate 240 so that lid street 244 when fully formed provides access to device bond pads 224, and 224' disposed on electronic devices 222 and 222' respectively. Lid street 244 has lid street width 245. Bond pads 224 and 224' each have bond pad widths 225 and 225' respectively. Bond pad widths 225 and 225' are determined in the direction perpendicular to device street 226. In addition, bond pads 224 and 224' are separated by bond pad separation distance 238. Device street 226, in this embodiment, may have a street width less than or equal to bond pad separation distance 238. The particular street width utilized will depend on various factors such as the substrate material utilized including its mechanical and electrical properties, the bonding process utilized to form electrical connections to the bond pads, as well as the electrical characteristics of the electronic device. Device regions 230 and 230' are illustrated as single layers formed in substrate 220; however, as described above they may be in any combination of on or within substrate 220. In addition, as illustrated in FIGS. 2a and 2b, device regions 230 and 230' are formed at least partially within interspace regions 212 and 212', which are defined by device seals 218 and 218' respectively, substrate 220, and lid substrate 240. The process of aligning saw blade 215 to lid street 244, in this embodiment, includes utilizing pattern recognition techniques to determine the location of saw alignment targets (not shown) that are on lid substrate 240 or device substrate 220 or both so that saw blade 215 can be positioned in a desired position relative to lid street 244. The physical location of the saw blade in relation to X, Y, and Z axes is calibrated periodically so that the offset if any to the pattern recognition is known. Typical saw positioning accuracy is about 10 micrometers in the X, and Y axes and the Z axis height positioning accuracy is about 50 micrometers or better (3 sigma) depending on the frequency of the saw blade calibration. Various combinations of utilizing a single blade, multiple blades, a single cut, and multiple cuts may be utilized to create lid street 244 in this embodiment.

The present invention may utilize a wide variety of materials for lid substrate 240. Lid substrate 240 may be any suitable material including semiconductor, metal and alloy, inorganic dielectric materials, and polymeric materials. The particular material utilized for lid substrate 240 will depend on various factors, such as, the particular application in which the device will be utilized, both processing temperatures and operating temperatures of the device, the desired optical properties of the lid, and the thermal and mechanical properties of the lid. Generally, lid substrate 240 will be formed from various dielectric materials such as silicon, glasses, alumina, polycarbonates, and acrylics. However, in alternate embodiments conductive materials including various metals and alloys, also may be utilized. In those embodiments employing a metal or alloy material as a lid substrate, generally, a dielectric material will be disposed between the electrical conductor connected to the bond pads and the edge of the lid material to substantially hinder shorting of the electrical conductor to the lid. For example, aluminum which may be anodized to form an electrically insulating layer of aluminum oxide may be utilized as either the lid material or the electrical conductor or both. Another example is tantalum, which also may be anodized to form tantalum pentoxide or a tantalum oxide or mixture thereof. Although tantalum pentoxide is conductive above a particular applied voltage that voltage depends upon the exact conditions under which it is formed and thus, it may be utilized in those applications where the applied voltage will remain below that threshold. Still another example is the utilization of an inorganic or organic dielectric coating applied to either the electrical conductor, the lid, or both to provide electrical isolation.

Lid street 244, generally, has a width that is greater than or equal to the combined widths of bond pad widths 225 and 225' and bond pad separation distance 238. However, in alternate embodiments, it should be appreciated that lid street 244 may have a width that is less than the combined widths in those cases where the lid street width is sufficient to allow electrical connections to be formed to the bond pads such as, in those embodiments, employing a solder bump interconnection scheme whereby wicking may be advantageously utilized. Generally, lid street 244 has a width in the range from 150 micrometers to about 2000 micrometers, however, in alternate embodiments, utilizing bond pad widths less than about 50 micrometers, lid street widths in the range from about 30 micrometers to 150 micrometers also may be utilized.

After the saw blade is aligned to the lid street, the saw blade is operated, generally, at a spindle speed of about 3000 revolutions per minute and a feed speed of about 5 millimeters per second to partially cut through lid street 244 of lid substrate 240 forming lid trench 246 that includes trench bottom 248 as illustrated, in a cross-sectional view, in FIG. 2b. In alternate embodiments, other spindle speeds and feed speeds also may be utilized. The particular parameters utilized will depend on various factors and parameters such as the lid substrate material used, the width of the lid street, and the depth of the lid trench.

Figure 3A:
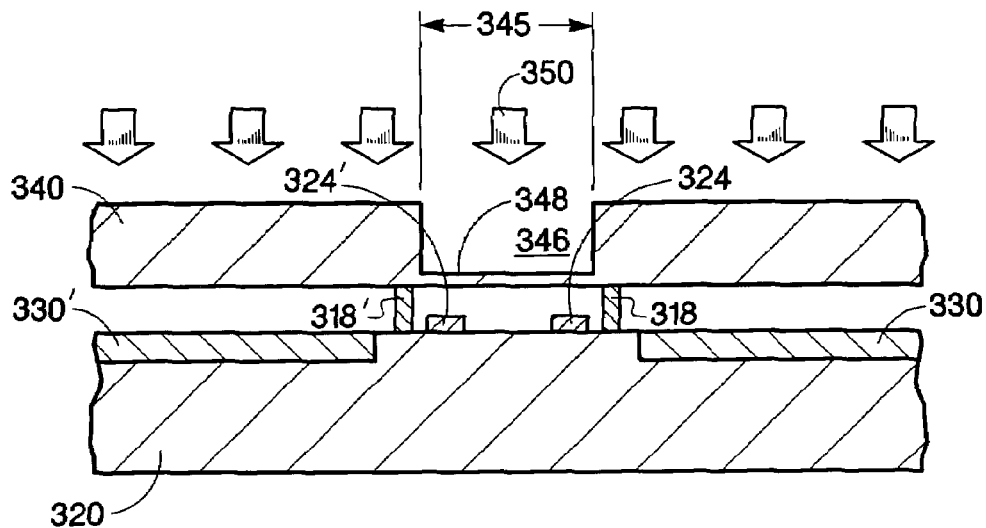
FIGS. 3a-3b are cross-sectional views of a trench removal process according to an embodiment of the present invention.
Figure 3B:
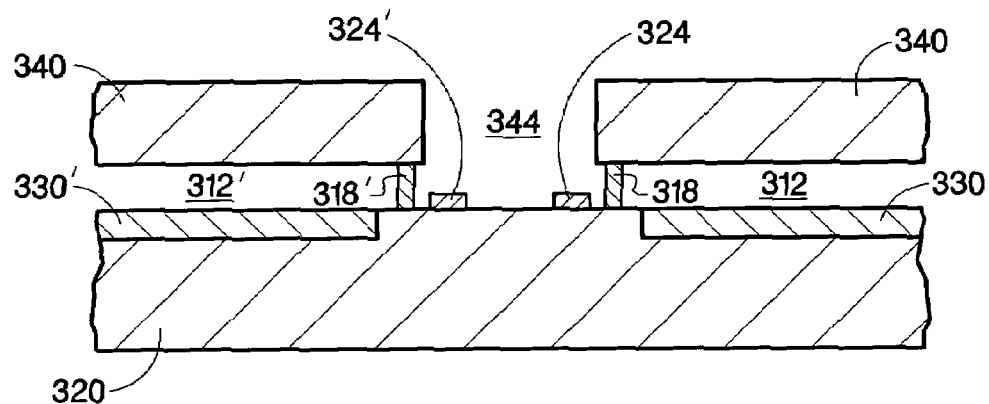

FIGS. 3a-3b are cross-sectional views of a portion of a lid substrate and device substrate illustrating a trench bottom removal process that may be employed to create embodiments of the present invention. Lid substrate 340 includes lid trench 346 and lid trench bottom 348. Lid substrate 340 is bonded to device substrate 320 by device seals 318, and 318'. Device substrate includes bond pads 324, and 324' and device regions 330 and 330'. In this embodiment, arrows 350 schematically illustrate, in FIG. 3a, the etching of lid substrate 340. The particular etching conditions utilized, in this embodiment, will depend on various factors such as the particular lid substrate material utilized, the thickness of trench bottom 348, and the width of lid street width 345. In one embodiment, reactive ion etching may be utilized. The particular reactive ion etching conditions employed will depend on various factors, and in particular on the material or materials used to form lid substrate 340. Generally, any reactive ion etching process suitable to etch the particular lid substrate material utilized may be employed in the present invention. For example, dry etches that may be employed to etch a silicon lid include fluorinated hydrocarbon gases ($CF_x$), xenon difluoride ($XeF_2$), and sulfur hexafluoride ($SF_6$). In one embodiment, the etching process is performed at a pressure of about 10 milliTorr using a mixture of $C_4F_8/CF_4/Ar/SF_6$, at flow rates of 30/30/30/10 standard cubic centimeters (sscm) respectively. Dry etchants that may be utilized to etch silicon dioxide, various glasses including low temperature oxides and phosphosilicate glasses, silicon nitride, as well as silicon include $CF_4$ plus oxygen and $SF_6$ plus Oxygen. Generally, these etchants target silicon dioxide but may under certain conditions etch silicon even faster than the oxide. An oxygen etch, typically, may be utilized to etch polymer lid materials. Xenon difluoride also may be utilized to etch metals that form volatile fluorides such as titanium, tungsten, molybdenum, and tantalum.

In an alternate embodiment, other dry etching or ion milling techniques also may be utilized. For example, inert gas ion etching using any inert gas such as neon, argon, krypton, xenon, nitrogen, and mixtures thereof may be utilized. In addition, the inert gas etching may utilize uniform ion etching (as illustrated in FIG. 3a) or focused ion beamed etching or milling (not shown) techniques. In those embodiments utilizing uniform ion etching, the thickness of lid substrate 340 will be reduced approximately the thickness of trench bottom 348; whereas in those embodiments utilizing a focused beam generally the thickness of the lid substrate will not be reduced.

Figure 3C:
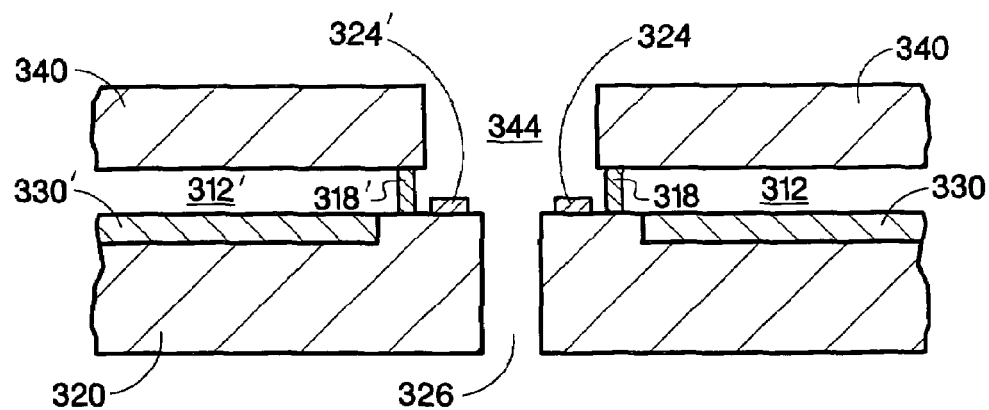
FIG. 3c is a cross-sectional view of a device singulation process according to an embodiment of the present invention.
Figure 3D:
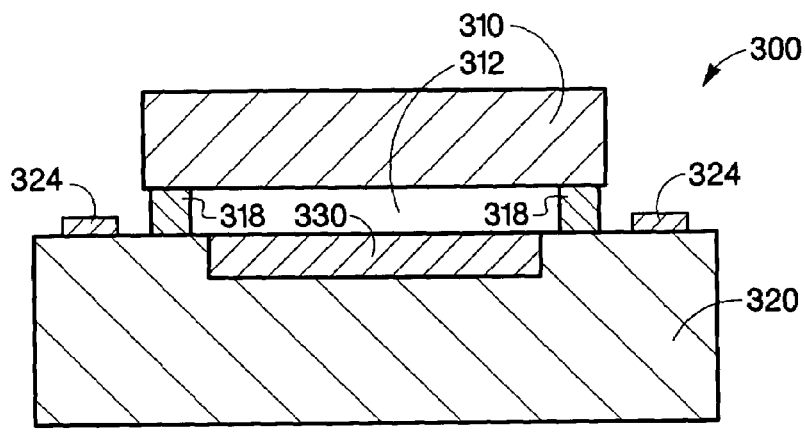
FIG. 3d is a cross-sectional view of a singulated hermetically sealed electronic device according to an embodiment of the present invention.

Wet etching of trench bottom 348 also may be utilized, as well as various combinations of wet and dry etching in embodiments of the present invention. For example, silicon compatible wet etches include tetramethyl ammonium hydroxide (TMAH), potassium or sodium hydroxide (KOH and NaOH), and ethylene diamine pyrochatechol (EDP). An isotropic silicon etchant includes nitric acid, water, and ammonium fluoride. Solvents such as acetone, methanol, isopropanol, tetrahydrofuran, and methylene chloride may be utilized to etch, to remove, or combinations of etching and removing various polymer lid materials. A sulfuric peroxide or sodium hydroxide wet etch may be utilized to etch an aluminum lid material, or an etchant solution having 16 parts phosphoric acid, 9 parts nitric acid, 1 part acetic acid, and two parts water also may be utilized to etch aluminum. Chromium may be removed utilizing a wet etch including ceric ammonium nitrate ($Ce(NH_4)_2(NO_3)_6$) and perchloric acid ($HClO_4$). For more information on various etches that may be utilized see for example Kirt R. Williams et al., *Etch Rates for Micromaching Processing-Part II*, Journal of Microelectromechanical Systems, Vol. 12, No. 6, December 2003. In addition to wet etching or dry etching or combinations of both, other material removal techniques such as laser ablation, and grit blasting also may be utilized separately or in various combinations to remove trench bottom 348 in alternate embodiments. After removal of trench bottom 348 is completed lid street 344 is formed. Device street 326, as shown, in a cross-sectional view, in FIG. 3c, may be formed in substrate 320 utilizing any of a wide range of techniques such as sawing, laser ablation, water jetting, and grit blasting. For those embodiments utilizing a flexible polymer substrate material, slitting and other cutting techniques also may be utilized to form device street 326 in substrate 320. An illustration of a fully packaged hermetically sealed device having contact pads exposed that is obtained after device street 326 is formed is shown in a cross-sectional view in FIG. 3d. In this embodiment, device lid 310 is bonded to device substrate 320 by device seal 318. Device substrate includes bond pads 324. Although bond pads 324 are illustrated as being on two opposing sides of hermetically sealed electronic device 300 it should be understood that bond pads 324 may be disposed on one side or on multiple sides of the device depending on the particular application in which the device will be utilized. In addition, multiple rows of bond pads also may be utilized on one or more sides. Interspace region 312 is defined by device seal 318, substrate 320, and device lid 310 with device region 330 disposed within device seal 318; however, in alternate embodiments, device region 330 also may be only partially within device seal 318.

Figure 4:
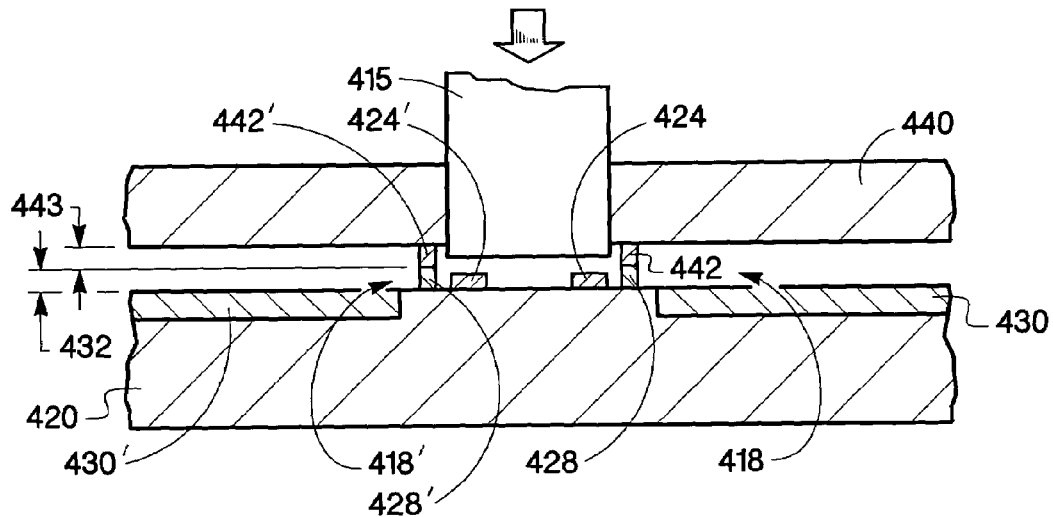
FIG. 4 is a cross-sectional view of a sawing process according to an alternate embodiment of the present invention.

An alternate method of forming a lid street is shown, in a cross-sectional view, in FIG. 4. In this embodiment, saw blade 415 saws through lid substrate 440 to form the lid street. Lid bond rings 442 and 442' have lid bond ring height 443 and device bond rings 428 and 428' have device bond ring height 432 which are separately or in combination sufficient in height to form device seals 418 and 418' so that saw blade 415 causes little or no damage to bond pads 424 and 424' when sawing through lid substrate 440. For example, the combined gap height can be 50 micrometers or more to ensure that the saw blade or blades do not damage the contact pads on the device for those embodiments where the Z axis height positioning accuracy is about 50 micrometers. Generally, for a particular setting an average depth of cut may be determined and the height of device seals 418 and 418' is formed to exceed the average depth of cut. Device regions 430 and 430' are illustrated as single layers formed in device substrate 420; however, as described above they may be in any combination of on or within device substrate 420.

Figure 5:
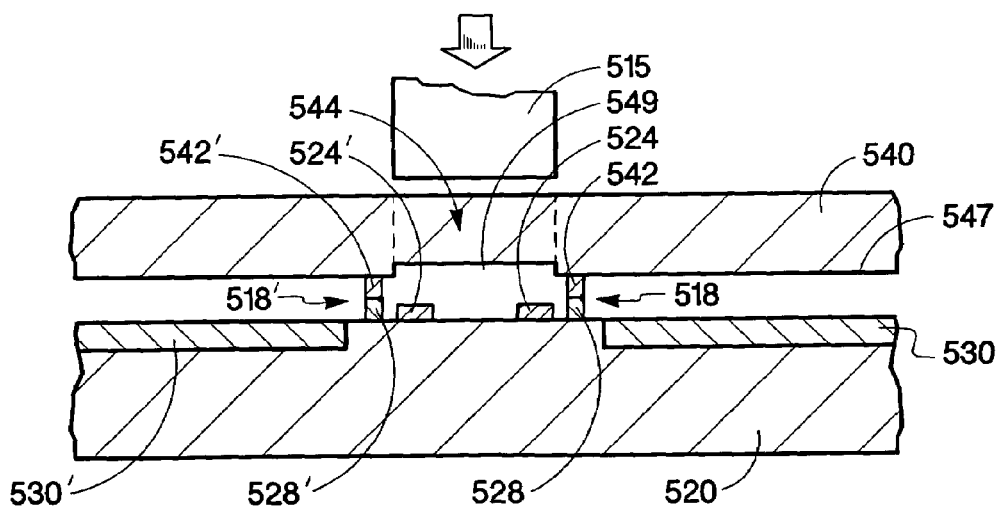
FIG. 5 is a cross-sectional view of a lid substrate and a sawing process according to an alternate embodiment of the present invention.

An alternate method of forming a lid street is shown in a cross-sectional view in FIG. 5. In this embodiment, lid substrate 540 includes lid channel 549 formed on lid bond surface 547 of lid substrate 540. Lid channel 549 may be formed in lid substrate 540 by any of a wide variety of techniques such as sawing, dry or wet etching, laser ablation, ion milling, grit blasting, and water jetting. In particular for polymeric lid substrate materials micro-molding also may be utilized. Lid channel 549 may be formed in lid substrate 540 either prior to or after lid bond rings 542 and 542' are formed. The particular order will depend on various factors such as the bonding technique utilized, the material utilized to form lid substrate 540, and the technique utilized to form lid channel 549. In addition, the depth of lid channel 549 may be varied. The depth will generally depend on the technique utilized to form the channel as well as the particular material utilized to form lid substrate 540. Lid bond rings 542 and 542' and device bond rings 428 and 428' form device seals 518 and 518'. After device seals 518 and 518' are formed saw blade 515 is utilized to cut through the remaining material of lid substrate 540 until lid channel 549 is reached thereby forming lid street 544. Device regions 530 and 530' are illustrated as single layers formed in device substrate 520; however, as described above they may be in any combination of on or within device substrate 520.

Figure 6:
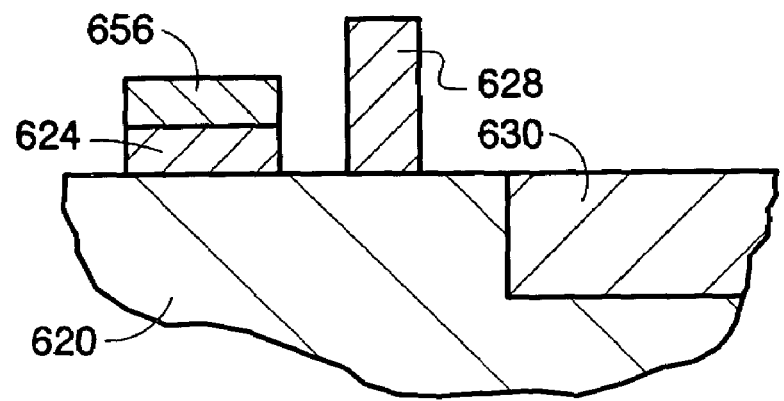
FIG. 6 is a cross-sectional view of a protective layer disposed over a bond according to an alternate embodiment of the present invention.

An alternate embodiment of the present invention utilizing a bond pad protective layer disposed over a bond pad is shown, in a simplified cross-section view, in FIG. 6. In this embodiment, bond pad protective layer 656 is disposed over bond pad 624. Bond pad 624 is disposed on substrate 620 that includes device region 630 and device bond ring 628. The protective layer, in this embodiment, is polyvinylalcohol which is water soluble and may be washed off of the bond pads after singulation of the electronic die is complete. In alternate embodiments, other protective layer materials also may be utilized such as various metals, other polymeric materials, and inorganic dielectrics. Aluminum, tungsten, and tantalum are examples of metals that may be utilized. Amorphous silicon, tetraethylorthosilicate (TEOS)), phosphorus doped spin on glass (SOG), and phosphosilicate glasses are examples of inorganic dielectrics that may be utilized. A wide variety of polymeric materials such as photoresists that may be wet etched, dry etched or combinations of both also may be utilized, in this embodiment. Protective layer 656 may be utilized in the various embodiments described herein.

Figure 7:
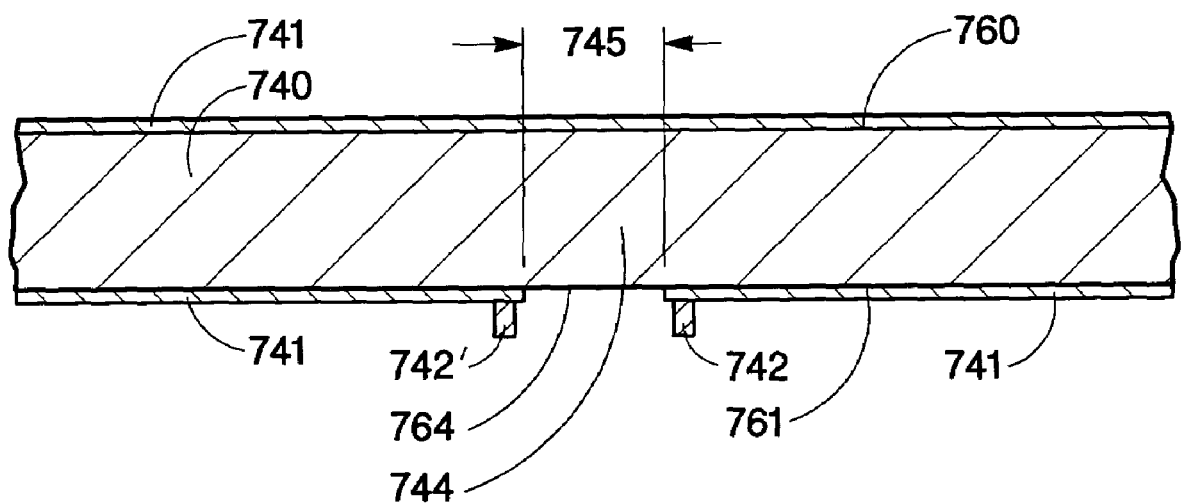
FIG. 7 is a cross-sectional view of a protective layer on a lid substrate according to an alternate embodiment of the present invention.

An alternate embodiment of the present invention utilizing a protective layer on a lid substrate is shown, in a cross-section view, in FIG. 7. In this embodiment, lid protective layer 741 is formed on lid major surfaces 760 and 761 of lid substrate 740. Protective layer 741 may be formed uniformly over internal lid surface or lid major surface 761. A subtractive or additive (i.e. lift off process) process may be utilized to generate an area in the region of lid street 744 where the protective layer is absent. Lid bond rings 742 and 742', in this embodiment, are formed on protective layer 741; however, in alternate embodiments, lid bond rings 742 and 742' may be formed directly on lid substrate 740 within the area where the protective layer is absent. Protective layer opening 764, in this embodiment, has lid street width 745; however, in alternate embodiments the width of opening 764 may be larger or smaller than lid street width 745. In this embodiment, lid substrate 740 is silicon and protective layer 741 is a thick silicon oxide layer formed thereon. In alternate embodiments, a wide variety of other lid substrate materials and protective layers also may be utilized. For example, the lid substrate material may be aluminum and the protective layer is aluminum oxide formed by anodization. Another example is a glass lid substrate having a silicon nitride protective layer. In one embodiment, protective layer 741 is formed only on external lid surface 760, such as a glass lid having a photoresist or other polymeric layer that may later be removed. Such a protective layer is advantageous in those embodiments utilizing a dry or wet etch and etching of the top or exposed surface of the lid substrate is not desired. In still other embodiments, protective layer 741 is uniformly formed only on internal lid surface 761, such as a silicon lid having an aluminum protective surface that may be wet or dry etched or a combination of both using etchants that either do not etch silicon or etch silicon at a slower rate than aluminum. Such a protective layer is advantageous in those embodiments where patterning of the protective layer is not desired, it is advantageous to form the lid bond ring on the protective layer, or both.

Figure 8A:
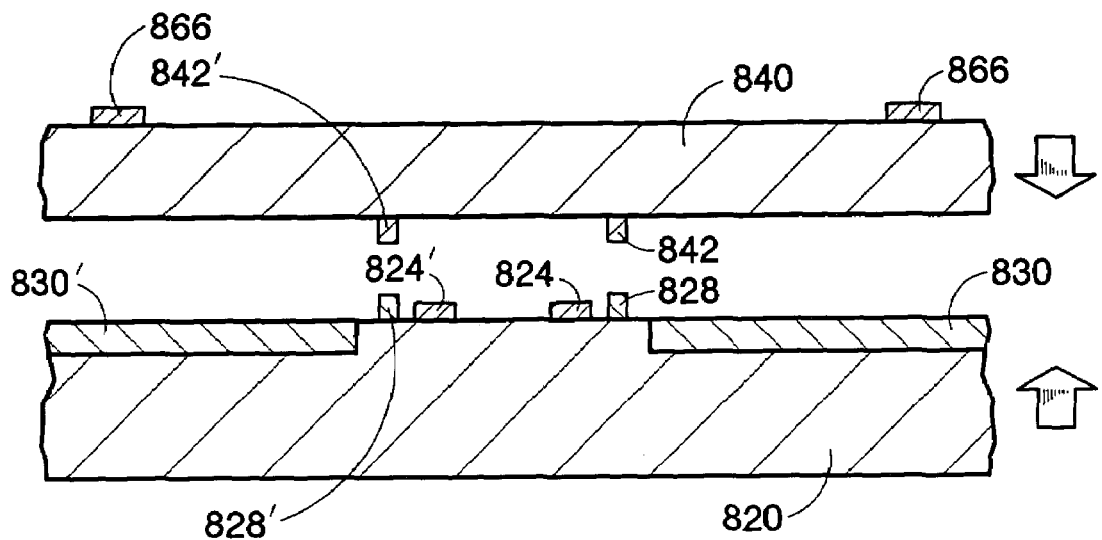
FIGS. 8a and 8b are cross-sectional views of a bonding process according to an embodiment of the present invention.
Figure 8B:
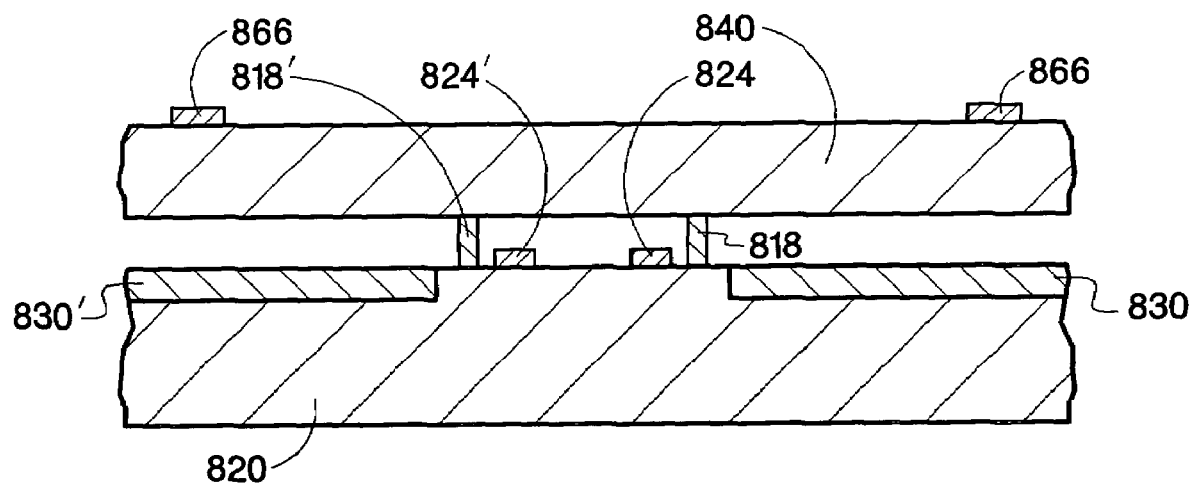

FIGS. 8a-8b are cross-sectional views of a bonding process that may be used to create embodiments of the present invention. In this embodiment, lid bond rings 842 and 842' are disposed on lid substrate 840. Bond pads 824 and 824' are disposed on device substrate 820 and are disposed between device bond rings 828 and 828'. As described above various combinations of active, passive, and MEMs devices are represented by device regions 830 and 830'. In this embodiment, a bond aligner such as that sold by EVGroup GmbH under the EV620 series is utilized to align lid substrate 840 to device substrate 820. The aligner is equipped with bottom side microscopes that are utilized to adjust the alignment marks on the lid substrate to the device substrate. For example, in those embodiments that utilize a silicon lid and a silicon device substrate the silicon device substrate may be loaded into a bond chuck with bond ring side down. The alignment keys on the silicon device substrate are captured and then the objectives of the bottom side microscope are moved to the position of the alignment marks on the screen, the objectives are then fixed. The silicon lid with lid bond rings up is then loaded into the bond chuck. Silicon lid substrate 840 is then adjusted so that alignment marks 866 disposed on the backside of the lid substrate are aligned to the captured image of the silicon device substrate. It should be noted that alignment marks 866 are depicted in FIG. 8*b* as simple rectangular structures disposed on lid substrate 840 to simplify the drawing. It should be appreciated that alignment marks 866 typically can be realized as a stack of thin film layers formed on lid substrate 840 or various structures etched into the lid substrate or various combinations of both. The substrates are manually clamped within the chuck and the chuck may then be unloaded. After bonding is completed device seals 818 and 818' are formed as illustrated in a cross-sectional view in FIG. 8*b*.

A number of bonding techniques are known for joining substrates including intermediate-layer bonding (such as adhesive, glass frit, or solder), anodic bonding, thermal compression bonding, fusion bonding, etc. The selection of a bonding technique to be used for specific substrates may vary depending on thermal budget, hermeticity requirements, and properties of the bond interface, as just a few examples. In this embodiment, lid bond rings 842 and 842' and device bond rings 828 and 828' may utilize a gold-silicon eutectic or a softer lower melting-point solder, and are just a couple of examples of the various materials that may be utilized to form device seals 818 and 818'. In alternate embodiments, a frit glass seal may be utilized. The material utilized for the bond rings will depend on the particular materials utilized for the lid and device substrates. In this embodiment, device seals 818 and 818' may be formed by a variety of techniques such as, for example, thermal compression bonding or brazing, as well as other techniques.

A low melting-point inorganic oxide such as lead oxide or boric oxide may also be used for lid bond rings 842 and 842' and device bond rings 828 and 828' to generate device seals 818 and 818'. In still other embodiments, anodic bonding also may be utilized to form device seals 818 and 818'. In addition, plasma-activation of semiconductor bonding surfaces enables direct covalent bonding and has found applications from silicon-on-insulator (SOI) substrate fabrication to 3-dimensional substrate stacking. Typically, a plasma surface activation process involves a brief $O_2$ or $N_2$ plasma treatment of polished bond surfaces of lid bond rings 842 and 842' as well as device bond rings 828 and 828' followed by a wet-dip process in a standard clean one (SC1) or de-ionized water bath. An alternative process utilizes both the gas plasma treatment on the bond ring surfaces followed by a subsequent water plasma treatment of those surfaces.

What is claimed is:

1. A method of singulating electronic devices, comprising:
    aligning a saw blade over a lid street disposed on a lid substrate, said lid substrate disposed over a device substrate having an electronic device disposed on said device substrate, said electronic device having a bond pad, wherein said lid street is disposed over said bond pad;
    bonding said lid substrate to said electronic device substrate utilizing a gas plasma treatment on a surface of a lid bond ring surface and/or a device bond ring surface;
    sawing partially through said lid street to form a trench in said lid street after said lid substrate is bonded to said electronic device substrate, said trench having a trench bottom in said lid substrate; and
    subsequently removing said trench bottom by exposing said lid substrate and said trench bottom to a blanket etch whereby said bond pad is exposed and said lid street is formed.

2. The method in accordance with claim 1, further comprises:
    creating a device street disposed on said device substrate, said device street having a device street width;
    creating said bond pad having a bond pad width in the direction perpendicular to said device street; and
    creating said lid street to include a lid street width equal to or greater than the sum of said bond pad width and said device street width.

3. The method in accordance with claim 1, wherein said electronic device further comprises a first and a second electronic device adjacent to and separated from each other by a device street having a device street width, said first electronic device having a plurality of first bond pads disposed along a first device periphery proximate to said device street, said plurality of first bond pads having a first bond pad width in the direction perpendicular to said device street, and said second electronic device having a plurality of second bond pads disposed along a second device periphery proximate to said device street, said plurality of second bond pads having a second bond pad width in the direction perpendicular to said device street, wherein said lid street includes a lid street width greater than the sum of said first bond pad width, said second bond pad width, and said device street width.

4. The method in accordance with claim 1, further comprising:
    creating a device street disposed on said device substrate wherein said electronic device further comprises a first and a second electronic device adjacent to each other, said first and second electronic devices separated by said device street, said device street having a device street width;
    creating said bond pad on said first electronic device, said bond pad having a first bond pad width in the direction perpendicular to said device street; and
    creating a second bond pad on said second electronic device said second bond pad having a second bond pad width in the direction perpendicular to said device street, wherein said lid street includes a lid street width greater than the sum of said first and said second bond pad widths and said device street width.

5. The method in accordance with claim 1, wherein said electronic device further comprises a first and a second electronic device adjacent to each other, said first and second electronic devices separated by a device street, said first electronic device having a plurality of first bond pads disposed along a first device periphery proximate to said device street, said plurality of first bond pads having a first bond pad width in the direction perpendicular to said device street, and said second electronic device having a plurality of second bond pads disposed along a second device periphery proximate to said device street, said plurality of second bond pads having a second bond pad width in the direction perpendicular to said device street, said first and second plurality of bond pads having a bond pad separation distance wherein said lid street includes a lid street width greater than the sum of said first bond pad width, said second bond pad width, and said bond pad separation distance.

6. The method in accordance with claim 1, further comprising creating a device street disposed on said device substrate wherein said electronic device further comprises a first and a second electronic device adjacent to each other, said first and second electronic devices separated by said device street, said device street having a device street width;
creating said bond pad on said first electronic device, said bond pad having a first bond pad width in the direction perpendicular to said device street; and
creating a second bond pad on said second electronic device said second bond pad having a second bond pad width in the direction perpendicular to said device street, said bond pad and said second bond pad having a bond pad separation distance, wherein said lid street includes a lid street width greater than the sum of said first and said second bond pad widths and said bond pad separation distance.

7. The method in accordance with claim 1, further comprising forming a protective layer over a first surface of said lid substrate substantially opposed to a lid bonding surface, wherein sawing partially through said lid street forms a hard etch mask.

8. The method in accordance with claim 1, wherein utilizing said gas plasma treatment further comprises utilizing a water plasma treatment on said surface of said lid bond ring surface and/or said device bond ring surface.

9. The method in accordance with claim 1, wherein said bonding said lid substrate to said electronic device substrate further comprises utilizing a wet-dip process.

10. The method in accordance with claim 1, further comprising: aligning a saw blade over a device street disposed on said device substrate; and sawing through said device street.

11. The method in accordance with claim 1, further comprising forming a lid channel on a lid bonding surface of said lid substrate.

12. The method in accordance with claim 1, further comprising bonding an electrical conductor to said bond pad.

13. The method in accordance with claim 12, forming an electrical insulator disposed between said electrical conductor and said lid substrate.

14. The method in accordance with claim 1, further comprising forming a bond pad protective layer on said bond pad.

15. The method in accordance with claim 14, wherein forming a bond pad protective layer further comprises forming a polyvinylalcohol layer on said bond pad.

16. The method in accordance with claim 14, further comprising removing said bond pad protective layer.

17. The method in accordance with claim 14, wherein removing said bond pad protective layer further comprises washing said bond pad protective layer off of said bond pad.

18. A method of singulating electronic devices, comprising:
step for bonding a lid substrate to a device substrate utilizing a gas plasma treatment on a surface of a lid bond ring surface and/or a device bond ring surface, said lid substrate disposed over said device substrate, said device substrate having an electronic device disposed on said device substrate, said electronic device having a bond pad;
step for aligning a saw blade over a lid street disposed in said lid substrate;
step for sawing partially through said lid street to form a trench in said lid street after said lid substrate is bonded to said electronic device substrate, said trench having a trench bottom in said lid substrate; and
step for removing said trench bottom by exposing said lid substrate and said trench bottom to a blanket etch whereby said bond pad is exposed and said lid street is formed.

19. The method in accordance with claim 18, wherein said utilizing a gas plasma treatment further comprises utilizing a water plasma treatment on said surface of said lid bond ring surface and/or said device bond ring surface.

20. The method in accordance with claim 19, further comprising performing a wet-dip process.

21. A method, comprising:
aligning a lid wafer to a device wafer, said lid wafer having a plurality of lids disposed thereon and a plurality of lid street regions disposed between said plurality of lids, said device wafer having a plurality of devices disposed thereon, each device having a plurality of bond pads disposed around a periphery of said device, wherein said plurality of lid street regions are disposed over said plurality of bond pads;
bonding said lid wafer to said device wafer;
sawing partially through said lid wafer to form a trench in said lid street region after bonding said lid wafer to said device wafer, said trench having a trench bottom; and
subsequently removing said trench bottom by exposing said lid substrate and said trench bottom to a blanket etch whereby said bond pad is exposed and said lid street is formed.

22. The method in accordance with claim 21, wherein said bonding said lid wafer further comprises utilizing a water plasma treatment on said surface of said lid bond ring surface and/or said device bond ring surface.

23. The method in accordance with claim 22, further comprising performing a wet-dip process.

24. A method of singulating electronic devices, comprising:
bonding a lid substrate to a device substrate utilizing a gas plasma treatment on a surface of a lid bond ring surface and/or a device bond ring surface, said lid substrate having at least one lid street disposed thereon, said device substrate having two or more electronic devices disposed thereon, each device having a bond pad, wherein said at least one lid street is disposed over said bond pad;
sawing partially through said lid street toward a lid bonding surface to form a trench in said lid street, said trench having a trench bottom in said lid substrate; and
subsequently removing said trench bottom by exposing said lid substrate and said trench bottom to a blanket lid material removal process whereby said bond pad is exposed.

25. The method in accordance with claim 24, wherein said exposing said lid substrate and said trench bottom to a blanket lid material removal process further comprises exposing said lid substrate and said trench bottom to a blanket deep reactive ion etching.

26. The method in accordance with claim 24, wherein said exposing said lid substrate and said trench bottom to a blanket lid material removal process further comprises exposing said lid substrate and said trench bottom to a blanket wet etch.

27. The method in accordance with claim 24, wherein said exposing said lid substrate and said trench bottom to a blanket lid material removal process further comprises exposing said lid substrate and said trench bottom to a blanket inert gas ion etch.

28. The method in accordance with claim 24, wherein said exposing said lid substrate and said trench bottom to a blanket lid material removal process further comprises exposing said lid substrate and said trench bottom to a blanket grit blasting process.

29. The method in accordance with claim 24, wherein said utilizing a gas plasma treatment further comprises utilizing a water plasma treatment on said surface of said lid bond ring surface and/or said device bond ring surface.

30. The method in accordance with claim 29, further comprising performing a wet-dip process.

31. A method of singulating electronic devices, comprising:

aligning a saw blade over a lid substrate, said lid substrate bonded to a device substrate having an electronic device disposed on said device substrate, said electronic device having a bond pad;

sawing partially through said lid substrate toward a lid bonding surface to form a trench in said lid substrate, said trench having a trench bottom in said lid substrate, wherein a lid street is partially formed, said lid street disposed over said bond pad;

subsequently removing said trench bottom by exposing said lid substrate and said trench bottom to a blanket etch whereby said bond pad is exposed and said lid street is formed.

* * * * *